(12) United States Patent
Sagimori et al.

(10) Patent No.: US 8,022,418 B2
(45) Date of Patent: Sep. 20, 2011

(54) COMPOSITE SEMICONDUCTOR DEVICE, LED PRINT HEAD THAT EMPLOYS THE COMPOSITE SEMICONDUCTOR DEVICE, AND IMAGE FORMING APPARATUS THAT EMPLOYS THE LED PRINT HEAD

(75) Inventors: Tomohiko Sagimori, Tokyo (JP); Hiroyuki Fujiwara, Tokyo (JP); Mitsuhiko Ogihara, Tokyo (JP); Takahito Suzuki, Tokyo (JP)

(73) Assignee: Oki Data Corporation, Tokyo (JP)

( * ) Notice: Subject to any disclaimer, the term of this patent is extended or adjusted under 35 U.S.C. 154(b) by 31 days.

(21) Appl. No.: 11/737,153

(22) Filed: Apr. 19, 2007

(65) Prior Publication Data

US 2007/0246718 A1    Oct. 25, 2007

(30) Foreign Application Priority Data

Apr. 19, 2006   (JP) .................................. 2006-115319

(51) Int. Cl.
*H01L 33/38* (2010.01)

(52) U.S. Cl. ....... 257/88; 257/99; 257/91; 257/E27.121; 347/130; 347/238

(58) Field of Classification Search .................... 257/88, 257/89, 98, 432, 678, E33.056, E33.062, 257/79, 91, 99, E27.121; 347/112, 130, 238; 399/4

See application file for complete search history.

(56) References Cited

U.S. PATENT DOCUMENTS

| 6,236,065 | B1 * | 5/2001 | Kurahashi et al. | 257/93 |
| 6,624,839 | B2 * | 9/2003 | Gaudiana et al. | 347/238 |
| 6,781,246 | B2 * | 8/2004 | Fujiwara et al. | 257/780 |
| 7,221,044 | B2 * | 5/2007 | Fan et al. | 257/676 |
| 2004/0257797 | A1 * | 12/2004 | Suehiro et al. | 362/34 |

FOREIGN PATENT DOCUMENTS

JP   2004179641 A   6/2004

* cited by examiner

*Primary Examiner* — Victor A Mandala
*Assistant Examiner* — Scott Stowe
(74) *Attorney, Agent, or Firm* — Panitch Schwarze Belisario & Nadel LLP

(57) ABSTRACT

A composite semiconductor device includes a plurality of semiconductor thin films and a substrate on which the semiconductor thin films are attached. Each semiconductor thin film includes a plurality of semiconductor elements. Each semiconductor element includes a first contact region and a second contact region. The first contact region is connected to a first electrode, and the second contact region is connected to a second electrode. The semiconductor thin film is attached to a substrate such that the plurality of semiconductor elements are aligned in a row, and such that the first contact region and the second contact region are in the row of light emitting elements.

11 Claims, 11 Drawing Sheets ated, the driver circuits driving the thin film semiconductor device elements. The first contact region and the second contact region are connected to the driver circuits with thin film wirings.

COMPOSITE SEMICONDUCTOR DEVICE, LED PRINT HEAD THAT EMPLOYS THE COMPOSITE SEMICONDUCTOR DEVICE, AND IMAGE FORMING APPARATUS THAT EMPLOYS THE LED PRINT HEAD

BACKGROUND OF THE INVENTION

1. Field of the Invention

The present invention relates to a composite semiconductor device in which arrays such as light-emitting diode (LED) arrays are combined with driver circuits, a light-emitting diode (LED) print head that employs the composite semiconductor device, and an image forming apparatus that employs the LED print head.

2. Description of the Related Art

Among conventional electrophotographic printers is one that incorporates a light-emitting diode (LED) exposing unit. An LED exposing unit incorporates a plurality of LED array chips each of which includes a plurality of light emitting diodes (LEDs).

Many printers of late are capable of printing not only characters but also images. Printing images with high resolution places great demands on printers, leading to increasing number of LEDs used in an exposing unit. This increases the number of LED array chips and driver chips incorporated in the exposing unit.

Japanese patent Laid-Open No. 2004-179641 discloses one way of meeting these demands. Driver circuits are formed on a semiconductor substrate, and LED array chips are bonded on unused areas on the semiconductor substrate, thereby manufacturing a composite semiconductor device. The composite semiconductor devices are mounted on a printed circuit board instead of mounting individual LED arrays and driver circuits on the printed circuit board, thereby reducing the number of chips mounted on the circuit board. The LEDs on the LED array chips are electrically connected to corresponding driver circuits through electrodes formed on the bottom surface of the LED array chips.

In order to drive a plurality of LEDs formed on a single LED array chip on a time shared basis, each LED includes two electrodes, i.e., a p-side electrode and an n-side electrode wired independently of other LEDs. The two electrodes of each LED are formed on the front surface of the LED array chip, and are electrically connected to the driver circuit. The electrodes closer to light emitting regions are aligned in parallel to the row of the LEDs, and the electrodes farther from the light emitting regions are aligned beside the row of the LEDs substantially in parallel to the row of the LEDs.

Because the electrodes are formed in two parallel rows, the aforementioned LED array chip cannot be small in its widthwise direction, i.e., a direction perpendicular to a direction in which the LEDs are aligned. Therefore, the overall area of the LED array chip is difficult to make small. A thin film LED array chip is first fabricated on, for example, a GaAs substrate, and is then released from the GaAs substrate by etching. Consequently, an LED array chip having a large surface area requires a longer etching time.

SUMMARY OF THE INVENTION

An object of the invention is to solve the aforementioned problems.

Another object of the invention is to provide a composite semiconductor device capable of implementing a compact LED array chip of the thin film type.

Still another object of the invention is to provide an LED print head that employs the composite semiconductor device.

Yet another object of the invention is to provide an image forming apparatus that employs the LED print head.

A composite semiconductor device includes a plurality of thin film semiconductor device elements and a substrate. Each of the plurality of thin film semiconductor device elements includes a first contact region for first electrical connection and a second contact region for second electrical connection. The thin film semiconductor device elements are bonded on the substrate to dispose in a row, the first contact region and the second contact region being disposed to align to the row of thin film semiconductor device elements.

The substrate includes driver circuits formed on the substrate, the driver circuits driving the thin film semiconductor device elements. The first contact region and the second contact region are connected to the driver circuits with thin film wirings.

Each of the thin film semiconductor device elements includes a semiconductor thin film, a first electrode connected to the first contact region, and a second electrode connected to the second contact region. Adjacent thin film semiconductor device elements are arranged such that the first electrode of one of the adjacent thin film semiconductor device elements and the first electrode of the other of the adjacent thin film semiconductor device elements are disposed between the second electrode of the one of the adjacent thin film semiconductor device elements and the second electrode of the other of the thin film semiconductor device elements.

The thin film semiconductor device element may be a light emitting device.

The light emitting device may be a light emitting diode.

An LED print head incorporates the aforementioned composite semiconductor device. A supporting material supports a plurality of composite semiconductor devices including light emitting diode array, the light emitting diodes being disposed in a row. A lens array that directs light emitted from the light emitting diodes.

An image forming apparatus incorporates the LED print head includes an image bearing body, an exposing unit, and a developing unit. The exposing unit selectively illuminates a charged surface of the image bearing body to form an electrostatic latent image. The developing unit develops the electrostatic latent image.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

First Embodiment

Figure 1:
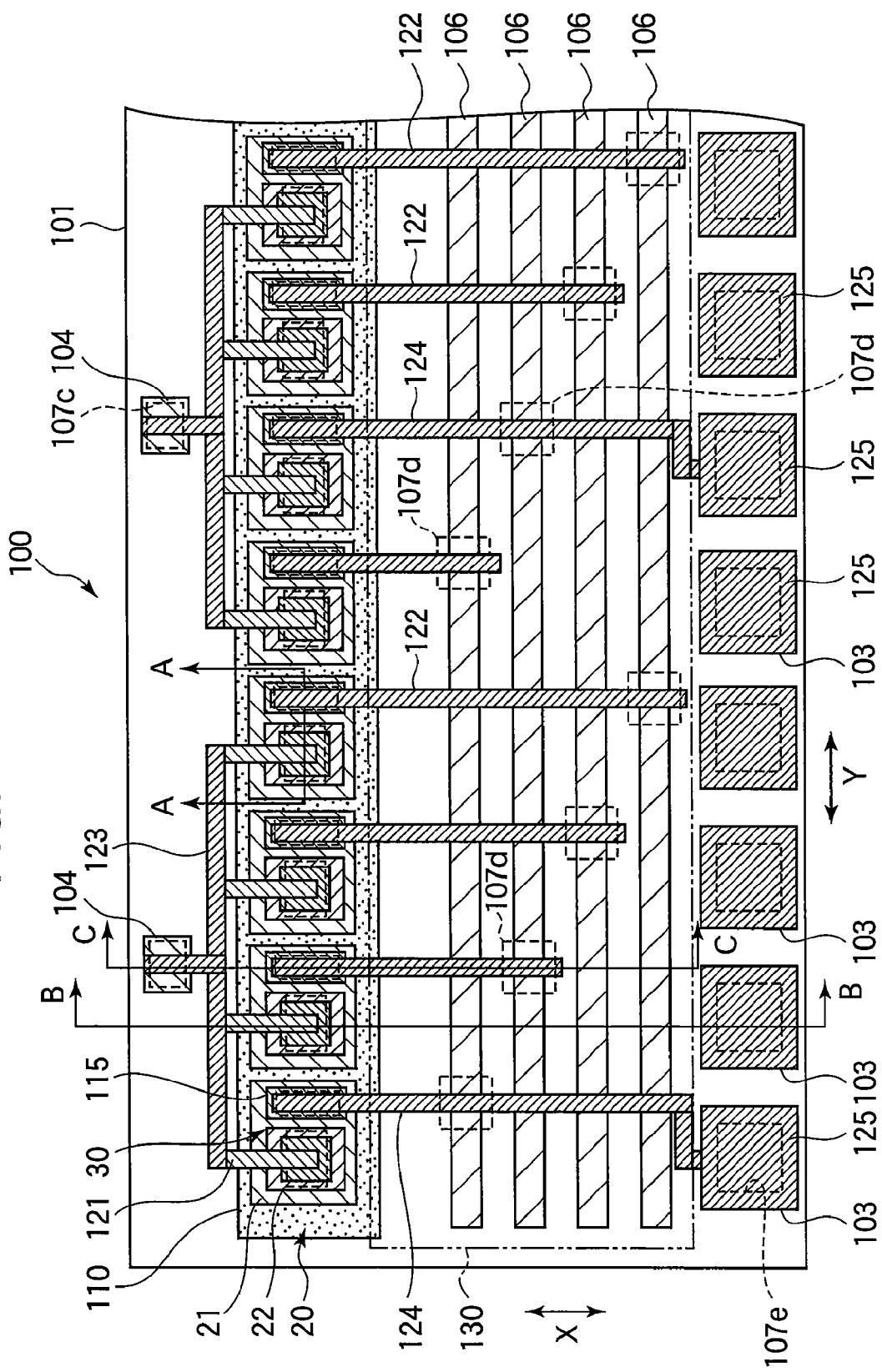
FIG. 1 is a top view of a composite semiconductor device of a first embodiment illustrating a pertinent portion.

FIG. 1 is a top view of a composite semiconductor device 100 of a first embodiment illustrating a pertinent portion.

Figure 2:
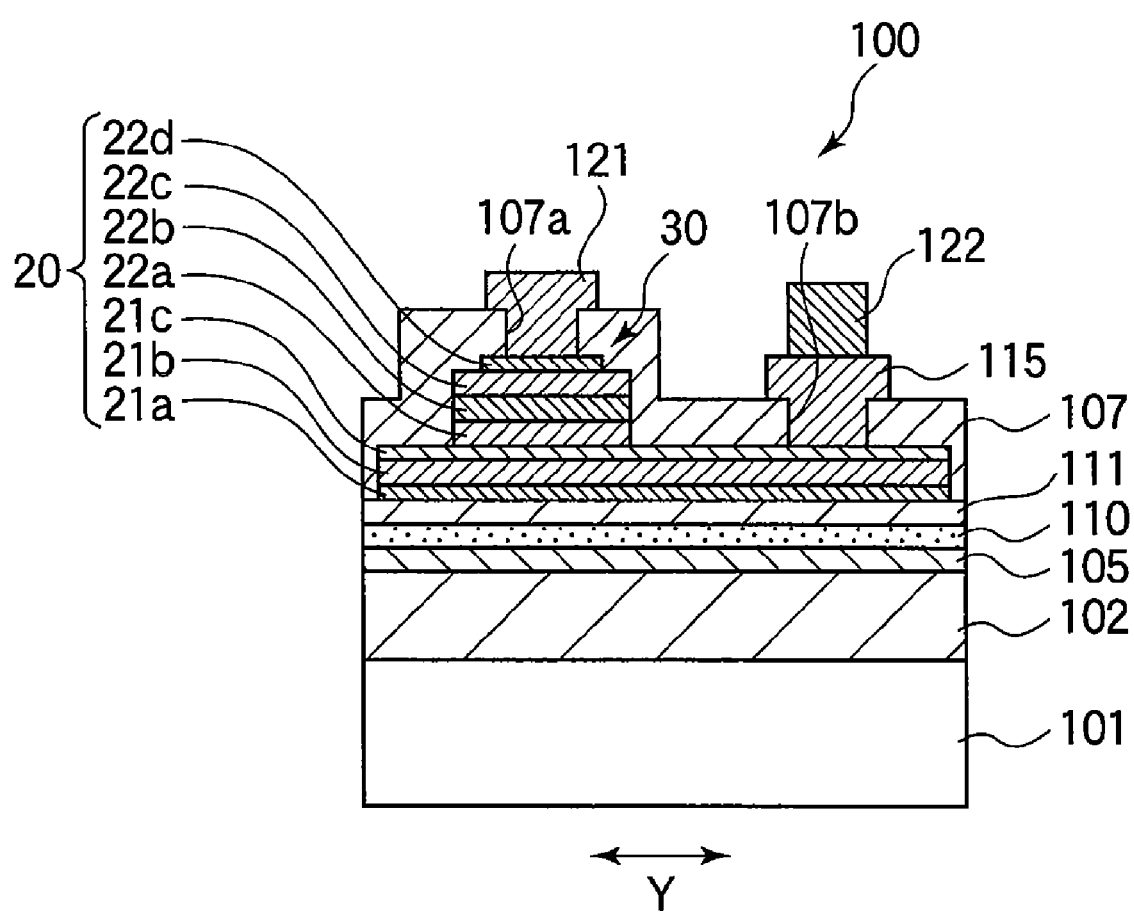
FIG. 2 is a cross-sectional view taken along a line A-A of FIG. 1.

FIG. 2 is a cross-sectional view taken along a line A-A of FIG. 1.

Figure 3:
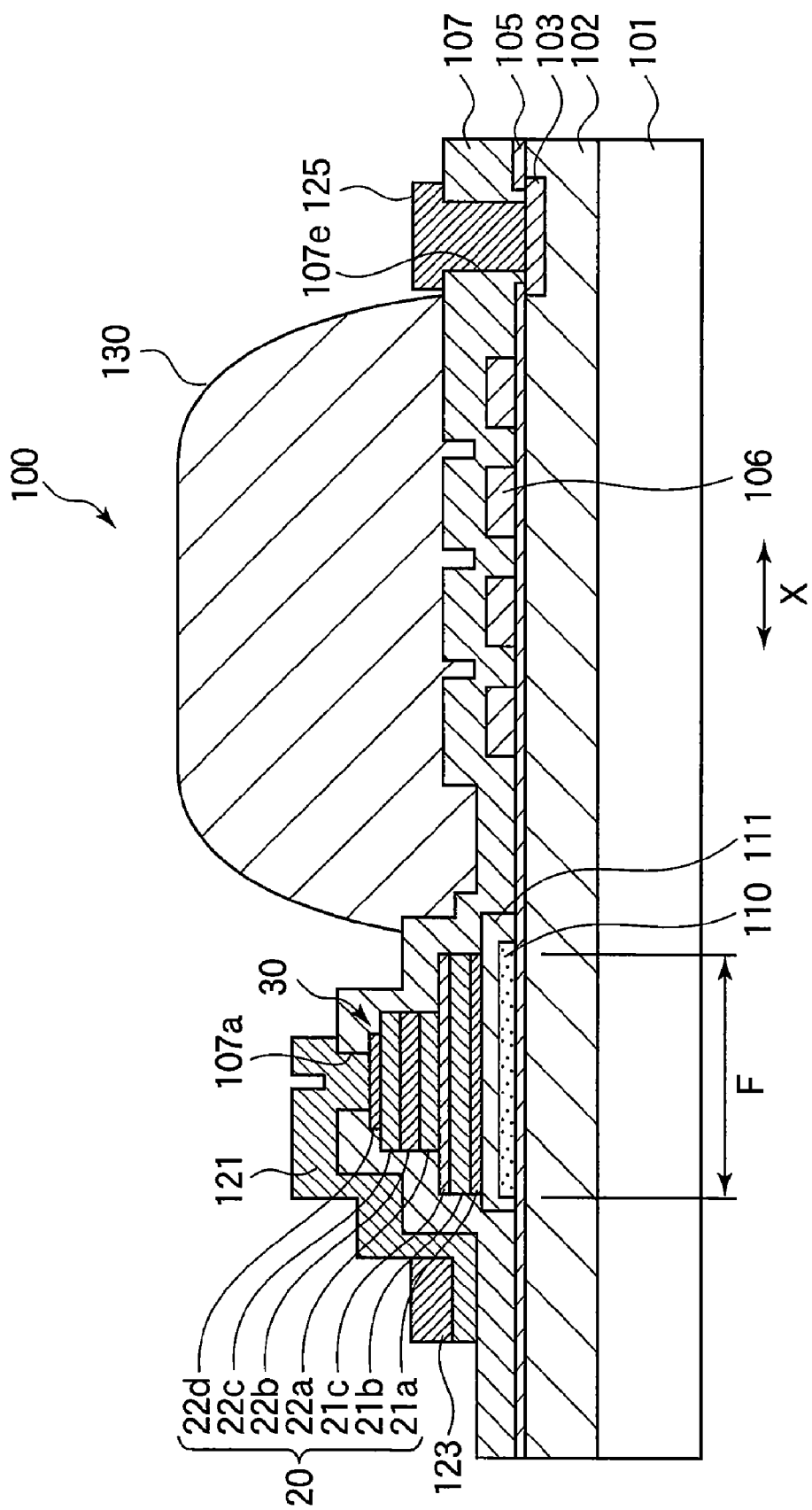
FIG. 3 is a cross-sectional view taken along a line B-B of FIG. 1.

FIG. 3 is a cross-sectional view taken along a line B-B of FIG. 1.

Figure 4:
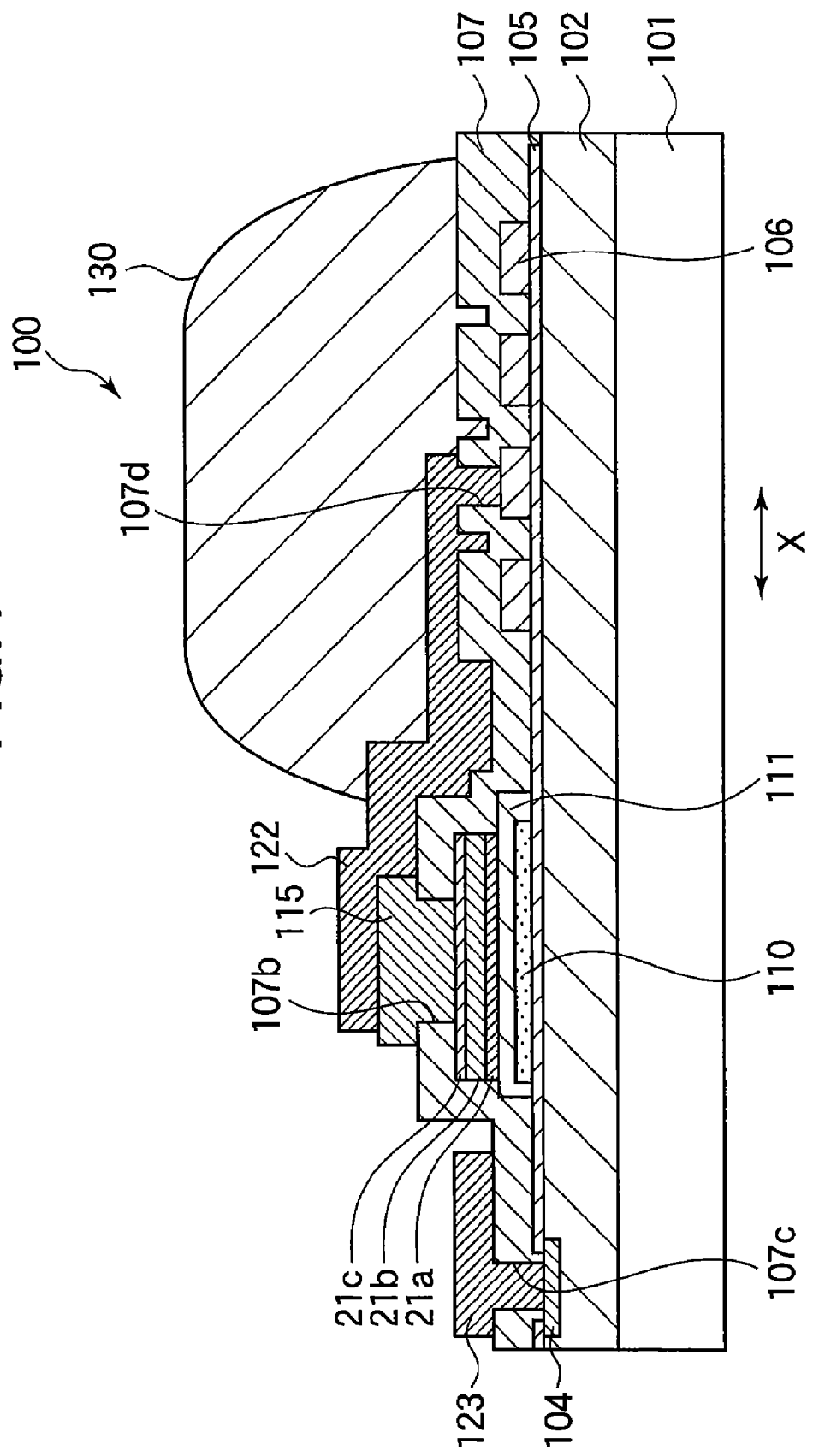
FIG. 4 is a cross-sectional view taken along a line C-C of FIG. 1.

FIG. 4 is a cross-sectional view taken along a line C-C of FIG. 1.

For simplicity's sake, FIG. 1 omits interlayer dielectric films 105 and 107 and a smoothing layer 111 which will be described later. Openings formed in the interlayer dielectric films 105 and 107 are shown in dotted lines.

Referring to FIG. 2, the composite semiconductor device 100 includes an Si substrate 101 and an integrated circuit/wiring pattern multilayer region 102 formed on the Si substrate 101. The integrated circuit/wiring pattern multilayer region 102 includes driver integrated circuits and a wiring pattern multilayer. The integrated circuit/wiring pattern multilayer region 102 is covered with connection pads 103 (FIG. 3), connection region pads 104 (FIG. 4), and the interlayer dielectric film 105 having openings.

A reflection layer 110 is located close to one widthwise (X direction in FIG. 1) end of the composite semiconductor device 100, and extends in a longitudinal direction (Y direction in FIG. 1) of the composite semiconductor device 100. The reflection layer 110 is covered with the smoothing layer 111 (FIGS. 3 and 4). A semiconductor thin film 20 is formed of an epitaxially-grown semiconductor multilayer structure that forms light emitting elements, and is bonded on the smoothing layer 111.

The integrated circuit formed in the integrated circuit/wiring pattern multilayer region 102 includes driver circuits that drive the light emitting elements. The connection pads 103 are used for feeding electric power to the integrated circuits and for communicating signals with external circuits. Some of the connection pads 103 are also used for electrically connecting the driver circuits to light emitting elements formed in the semiconductor thin film. Some of the connection pads 103 serve as a connection pad, being connected to n-side electrodes of corresponding light emitting elements.

The semiconductor thin film 20 is a multilayer structure that includes a bonding layer 21a of n-type GaAs, a conductive layer 21b of n-type $Al_tGa_{1-t}As$, an n-side contact layer 21c of n-type GaAs, a lower cladding layer 22a of n-type $Al_zGa_{1-z}As$, an n-type active layer 22b of an n-type $Al_yGa_{1-y}As$, an upper cladding layer 22c of p-type $Al_xGa_{1-x}As$, and a p-side contact layer 22d of p-type GaAs, stacked in this order from bottom to top.

The semiconductor thin film 20 is a multilayer structure that includes an upper structure 22 formed of the layers 22a-22d and a lower structure 21 formed of the layers 21a-21d. The lower structure 21 includes a plurality of island-shaped structures that are electrically isolated from one another, and that are aligned in a longitudinal direction of the composite semiconductor device 100. The upper structure 22 also includes a plurality of island-shaped structures that are electrically isolated from one another, and that are aligned in the longitudinal direction of the composite semiconductor device 100. Each island-shaped structure of the upper structure 22 is stacked on a corresponding island-shaped structure of the lower structure 21. The n-type active layers 22b of each of the island-shaped structures of the upper structure 22 serve as a light emitting region, i.e., light emitting element 30 (e.g., light emitting diode (LED)).

The composite semiconductor device of the aforementioned structure is formed as follows: A stack of semiconductor layers of first conductive type and second conductive type is formed. The stack of semiconductor layers includes a pn junction. The stack of semiconductor layers is a semiconductor thin film, and is bonded on the smoothing layer 111. Then, the entire structure is divided by mesa etching into electrically isolated individual light emitting elements 30. In this specification, reference numeral 20 is used to denote the semiconductor thin film both before and after mesa etching.

The reflection layer 110 reflects light emitted from the light emitting elements 30 back toward the light emitting surface of the semiconductor thin film 20. The reflection layer 110 is a layer of, for example, Ti, Ti/PtAu, TiAl, Cr/Au, NiAl, Ag, or an alloy containing Ag.

Referring to FIGS. 1 and 4, the connection region pads 104 are aligned along the reflection layer 110, each of the connection region pads 104 being formed in correspondence with four of the semiconductor thin films 20 and being connected to the integrated circuit. A plurality of common wires 106 (FIG. 3) are formed on the interlayer dielectric layer 105 near the widthwise middle portion of the composite semiconductor device 100, and extend in parallel to one another in the longitudinal direction of the composite semiconductor device 100. The semiconductor thin film 20 and the common wires 106 are covered with the interlayer dielectric film 107.

The n-side electrode 115 extends through an opening 107b formed in the interlayer dielectric film 107, and is in ohmic contact with the n-side contact layer 21c. The n-side electrode 115 is formed of, for example, AuGe/Ni/Au, and is in contact with a corresponding contact region of the n-side contact layer 21c of the light emitting element 30, so that the row of the electrodes 115 lies in the row of light emitting elements 30.

A p-side electrode 121 extends through an opening 107a formed in the interlayer dielectric film 107, and is in ohmic contact with a corresponding contact region of the p-side contact layer 22d of the light emitting element 30, so that the row of the contact region of the p-side contact layer 22d lies in the row of light emitting elements 30. The p-side electrode 121 is formed of, for example, Ti/Pt/Au. The four p-side electrodes 121 and the corresponding connection region pads 104 are connected to each other through a p-side wire 123 through the openings 107c formed in the interlayer dielectric film 107. The n-side electrodes 115 are connected to the corresponding common wires 106 by n-side electrodes 122 and 124 through openings 107d formed in the interlayer dielectric film 107. The n-side electrodes 122 and 124 are formed of, for example, Ti/Pt/Au. The n-side electrode 124 also connects the common wires 106 to the connection pads 103 through openings 107e formed in the interlayer dielectric film 107.

The n-side electrodes 115 function as an individual electrode while the p-side electrode 121 serves as an electrode common to each group of the four semiconductor thin films 20. Connection terminals 125 are formed on the connection pads 103 through openings 107e formed in the interlayer dielectric film 107. The connection terminals 125 are connected to the n-side electrodes 115 and wires (not shown) for external connection.

Referring to FIGS. 1, 3, and 4, a light blocking layer 130 is formed to cover a substantially entire area between the light emitting elements 30 and the connection terminals 125. The light blocking layer 130 prevents light spots from appearing due to the fact that the light emitted from the light emitting elements is reflected back by metal balls and/or the connection wires (not shown) connected to the connection terminals 125. For example, the composite semiconductor device 100 may be used as a light source for an LED print head of an image forming apparatus which will be described later. The light spots appearing at reflection points act as noise, in which case, the light blocking layer 130 is effective in eliminating light spots due to reflection.

The light blocking layer 130 may be a film of an organic material (e.g, thermosetting polyimide) or a light curable organic material. The purpose of the light blocking layer 130 is to prevent spots of reflected light from appearing as noise due to reflection of light by surrounding reflective bodies. The height and location of the light blocking layer 130 may be designed in accordance with the geometric location of the reflecting objects and the distance of the reflecting objects from the light emitting elements.

For example, the height of the light blocking layer 130 may be reduced by forming the light blocking layer 130 in the vicinity of the light emitting region. Here, the light emitting region is an area in the top view of the composite semiconductor device 100 from which light is emitted. If the light blocking layer 130 is within 10 μm from the light emitting region, the height of the light blocking layer 130 may be made less than 10 μm. A thick light blocking layer 130 has a large film stress, which may cause adverse effects to the semiconductor thin film. In order to avoid such effects, the light blocking layer 130 and the semiconductor thin film 20 are preferably disposed such that they do not overlap one another.

As described above, the row of the contact regions connected to the n-side electrodes 115 lies in the row of the light emitting regions. This shortens the widthwise dimension F (FIG. 3) of the composite semiconductor device 100. In addition, the light emitting region of the semiconductor thin film 20 may extend very close to the light blocking layer 130. This meets the requirement that the light blocking layer should be as close to the light emitting regions as possible.

While the light emitting elements 30 in the semiconductor thin film has been described as being formed of a compound semiconductor such as AlGaAs, the light emitting elements 30 may also be formed of another semiconductor material such as InP, GaAsP, GaInAsP, or AlGaAsP, or a nitride compound semiconductor material such as GaN, AlGaN, or InGaN. Although the first embodiment has been described with respect to the light emitting regions aligned in a single row, the arrangement of the light emitting regions and the number of rows of the light emitting regions may be modified as required. While the first embodiment has been described in terms of four light emitting elements in a single group such that the light emitting elements may be driven in a matrix mode, the number of groups and the number of light emitting elements in each group may be modified as required. The light emitting elements may be driven in a static mode instead of in a matrix mode.

The first embodiment has been described in terms of a integrated structure of an integrated circuit and light emitting elements fabricated on an Si substrate. However, the present invention is not limited to a combination or integration of an integrated circuit formed on the Si substrate and light emitting elements. For example, an array of light emitting elements and an integrated circuit (e.g., integrated circuit formed on a polysilicon substrate) may be fabricated on a glass substrate. A ceramic substrate, a metal substrate, or an organic substrate may also be used. The light emitting elements may be replaced by sensor elements such as light receiving elements.

The first embodiment has been described with respect to the n-side electrode 115 and n-side wires 122 and 124 that are formed of different materials. The n-side electrode 115 and n-side wires 122 and 124 may be formed of the same material as long as the n-side electrode 115 and the n-side contact layer are in intimate contact with each other either with low resistance or in ohmic contact and the first conductive side wiring is in intimate contact with a base dielectric film.

As described above, the composite semiconductor device of the first embodiment includes a semiconductor thin film having light emitting elements formed on a substrate in which driver circuits are formed. The electrode contact regions (first conductive type) are disposed such that a row of the electrodes 115 lies in a row of light emitting elements (second conductive type). Therefore, a semiconductor thin film with a small width may be obtained.

Second Embodiment

Figure 5:
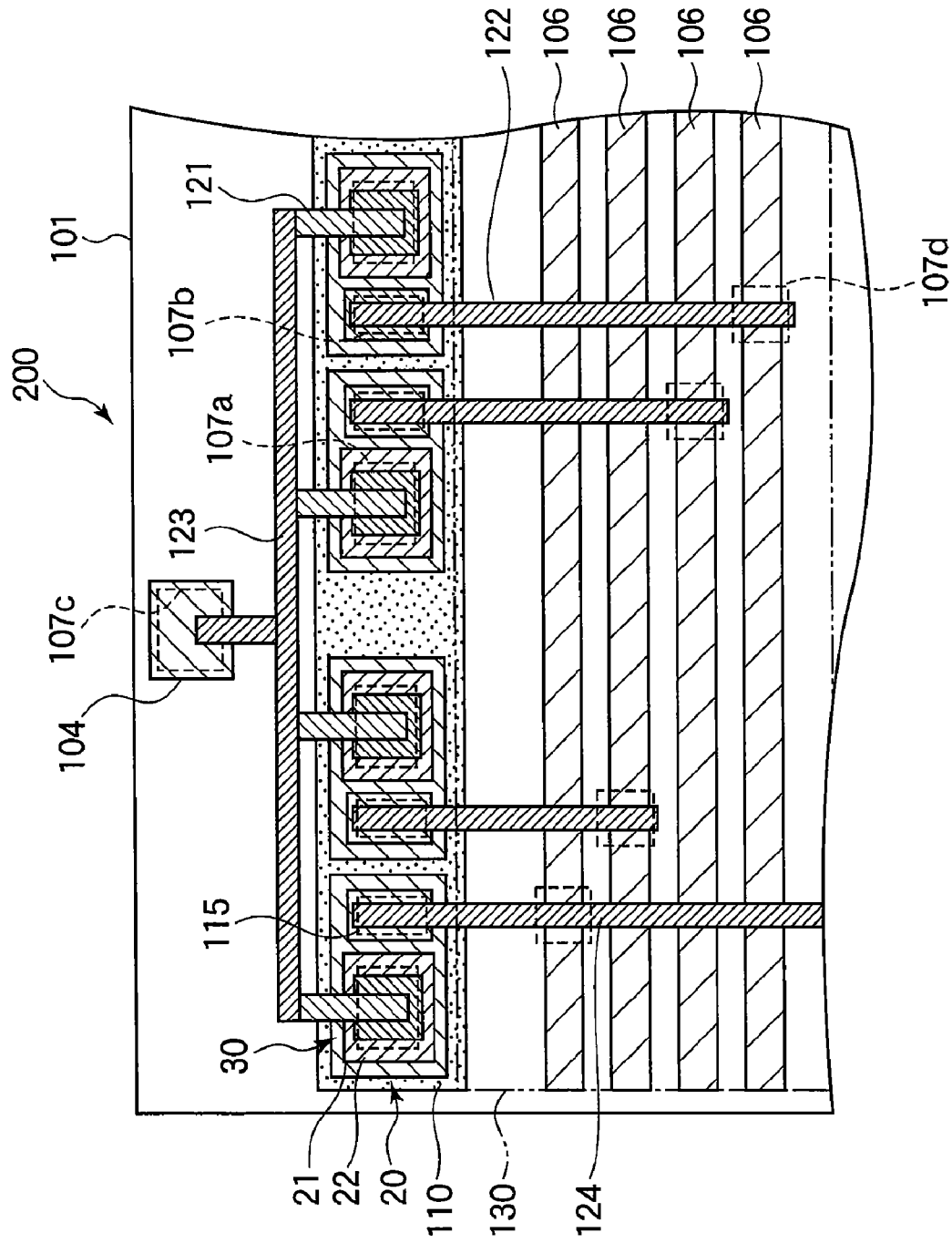
FIG. 5 is a top view of a composite semiconductor device of a second embodiment illustrating a pertinent portion.

FIG. 5 is a top view of a composite semiconductor device 200 of a second embodiment illustrating a pertinent portion.

The composite semiconductor device 200 differs from the composite semiconductor device 100 in that n-side electrodes 115 of adjacent light emitting elements are disposed side by side. Elements equivalent to those of the first embodiment are given the same reference numerals and their description is omitted.

Referring to FIG. 5, each light emitting element 30 includes a semiconductor thin film 20 and an n-side electrode 115 disposed side by side. A plurality of groups of two light emitting elements 30 are aligned in a row with such that the electrodes 115 are present between light emitting elements in each group and are absent between adjacent groups.

The semiconductor thin film 20 and n-side electrode 115 in each of two adjacent light emitting elements 30 are arranged such that the n-side electrodes 115 of the two adjacent light emitting elements 30 lie side by side and are between semiconductor thin films 20 of the two adjacent light emitting elements 30.

In addition, the first and last light emitting elements 30 (i.e., endmost light emitting elements in the row of light emitting elements) are closer to longitudinal ends of the composite semiconductor device 200 than their corresponding n-side electrodes 115 (only the first light emitting element and a longitudinal end are shown in FIG. 5).

Figure 6:
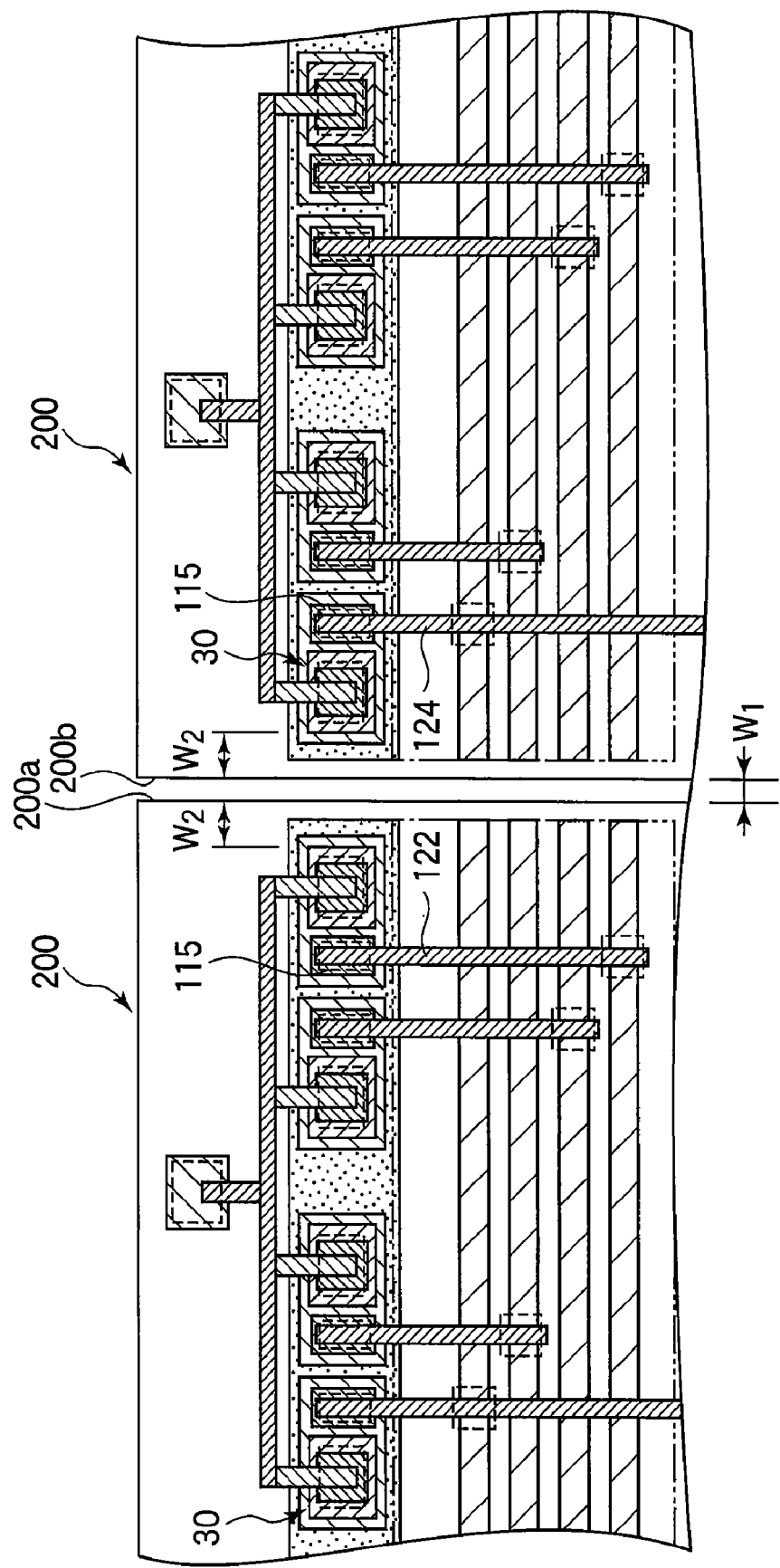
FIG. 6 illustrates end portions of adjacent composite semiconductor devices when the composite semiconductor devices are formed on a substrate (not shown) serially.

FIG. 6 illustrates endmost portions of adjacent composite semiconductor devices 200 when the composite semiconductor devices 200 are disposed on a substrate (not shown) in an end-to-end arrangement.

Referring to FIG. 6, the adjacent composite semiconductor devices 200a and 200b are spaced apart by a distance W1. For a print resolution of 600 dpi, the light emitting elements 30 are aligned at intervals of 42.3 μm or less, in which case, the adjacent composite semiconductor devices 200a and 200b should be disposed such that the distance between the endmost light emitting elements of the two composite semiconductor devices 200a and 200b is 42.3 μm or less.

Therefore, for the print resolution of 600 dpi, the endmost light emitting element of a composite semiconductor device 200 should be spaced apart by a short distance W2 from the longitudinal end of the composite semiconductor device 200. It should also be noted that the n-side electrode 115 is not present between the endmost light emitting region and the longitudinal end of the composite semiconductor device 200. The absence of the n-side electrode 115 between the endmost light emitting region and the longitudinal end of the composite semiconductor device 200 is advantageous in implementing a shorter distance of W2.

As described above, the row of the electrodes 115 lie in the row of semiconductor thin films 20. The n-side electrode 115 for the endmost light emitting region is farther away from the longitudinal end of the chip than the endmost light emitting region. In other words, the n-side electrode 115 is not present between the endmost light emitting region and the longitudinal end of the composite semiconductor device 200. Therefore, when the light emitting elements are formed at smaller intervals, the distance between the longitudinal ends of adjacent composite semiconductor devices may be shorter correspondingly, so that the spacing between the endmost light emitting elements of the adjacent composite semiconductor devices may be the same as that between the light emitting elements in each of the adjacent composite semiconductor devices.

Third Embodiment

Figure 7:
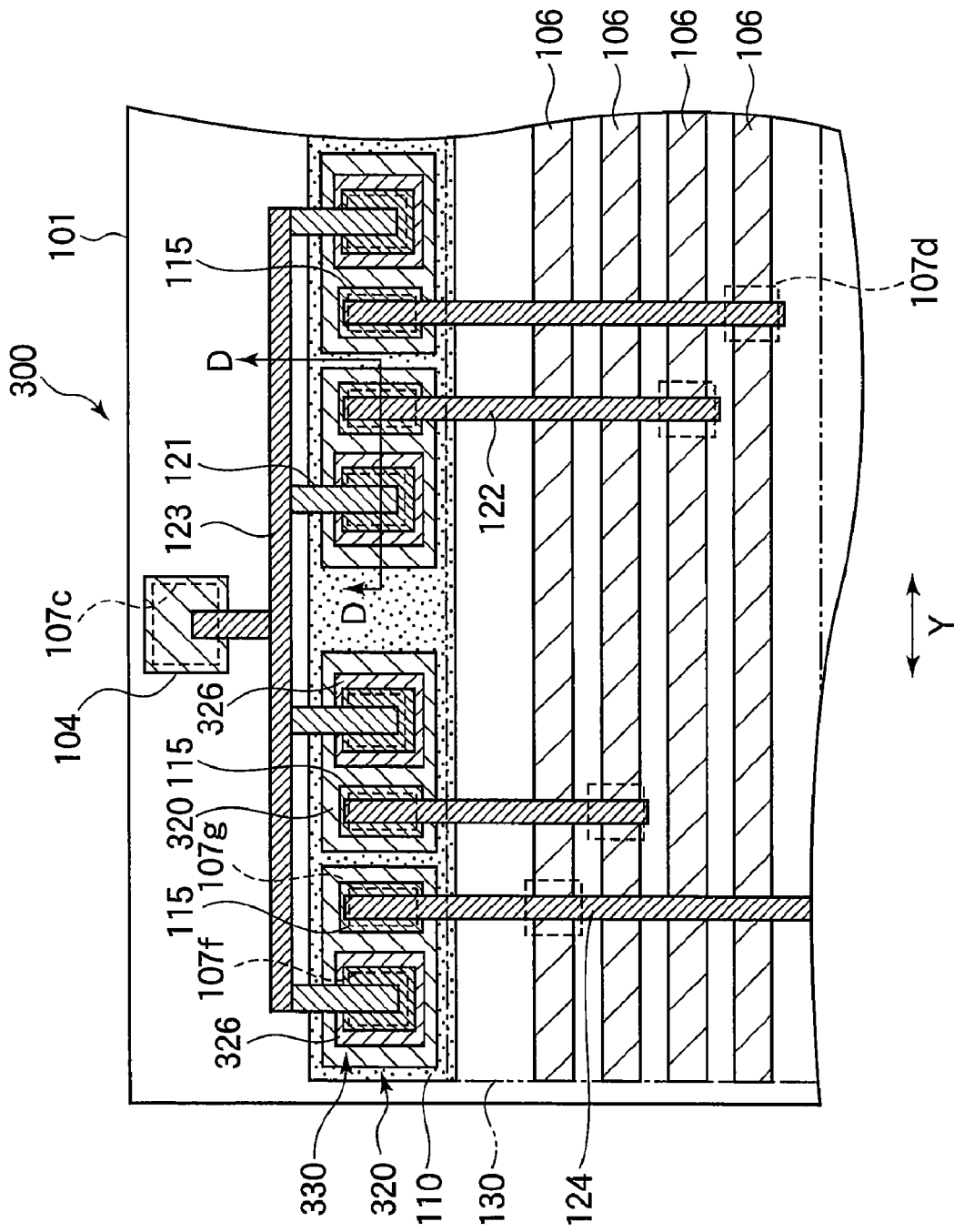
FIG. 7 is a top view of a composite semiconductor device of a third embodiment.
Figure 8:
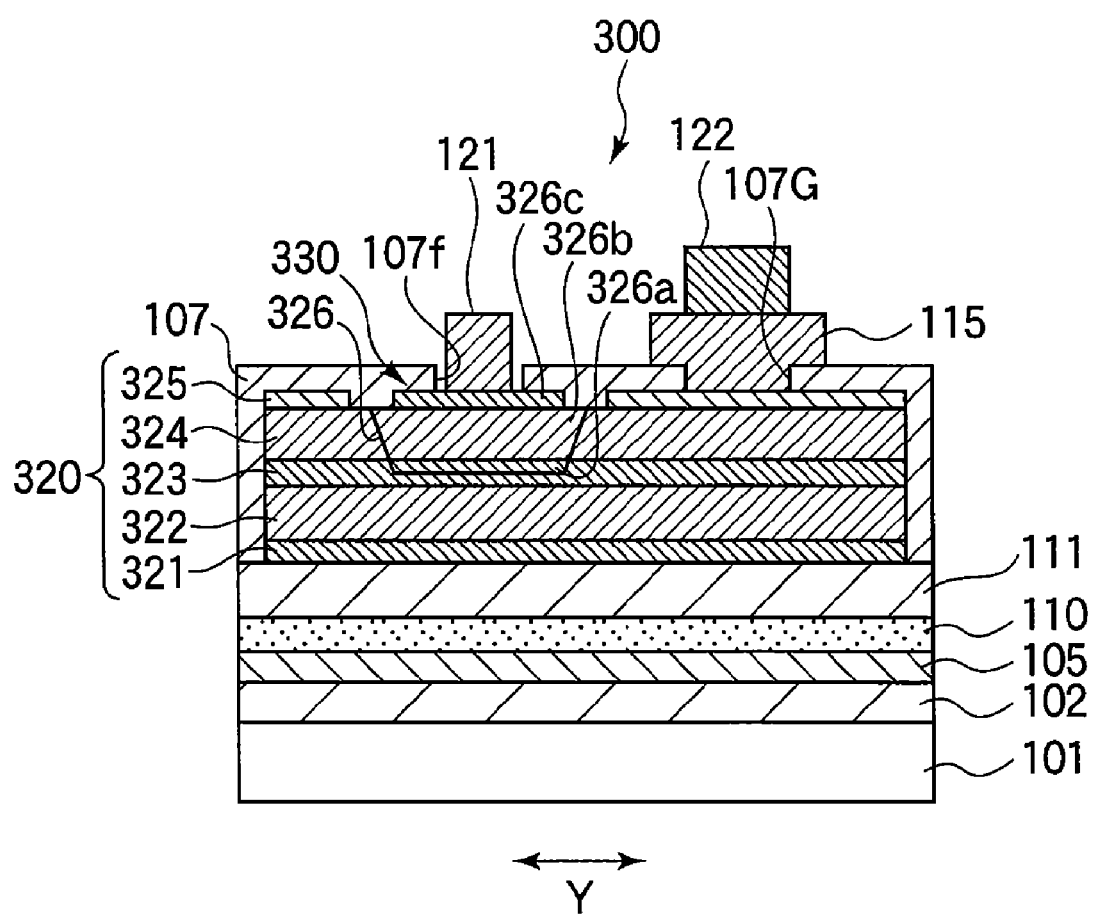
FIG. 8 is a cross-sectional view take along a line D-D of FIG. 7.

FIG. 7 is a top view of a composite semiconductor device 300 of a third embodiment. FIG. 8 is a cross-sectional view taken along a line D-D of FIG. 7. For simplicity's sake, interlayer dielectric films 105 and 107 and the smoothing layer 111, which will be described later, are omitted from FIG. 7.

Referring to FIG. 7, the row of the electrodes 115 lie in the row of semiconductor thin film 320. Each light emitting element 330 includes a semiconductor thin film 320 and an n-side electrode 115 that are disposed side by side. The semiconductor thin film 320 and n-side electrode 115 in each of two adjacent light emitting elements 330 are arranged such that the n-side electrodes 115 of the two adjacent light emitting elements 330 lie side by side and are between semiconductor thin films 320 of the two adjacent light emitting elements 330.

The composite semiconductor device 300 differs from the composite semiconductor device 200 of the second embodiment in that the semiconductor thin film layer is selectively doped with an impurity (e.g., diffusion) to form a light emitting region rather than isolating the semiconductor thin film layer into individual light emitting regions. Elements equivalent to those of the second embodiment are given the same reference numerals and their description is omitted.

Referring to FIG. 8, a semiconductor thin film 320 in which light emitting elements are formed is bonded on the upper flat surface of the smoothing layer 111. The semiconductor thin film 320 is a semiconductor of first conductive type (e.g., n-type), and is a multilayer structure that includes a bonding layer 321 of GaAs, a lower cladding layer 322 of $Al_zGa_{1-z}As$, an active layer 323 of $Al_yGa_{1-y}As$, an upper cladding layer 324 of $Al_xGa_{1-x}As$, and an upper contact layer 325 of GaAs, which are aligned in this order from bottom to top. The semiconductor thin film 320 includes a diffusion region 326 into which an impurity of second conductive type (e.g., p-type) is selectively diffused to form regions 326a-326c of second conductive type. The front of the diffusion region lies in an active layer to form a light emitting region. Light is emitted from a light emitting element (LED) 330 in the light emitting region.

The values of x, y, and z are related such that y<x and y<z. A p-side electrode 121 is in ohmic contact with a p-side contact layer 326c of the light emitting element 330 through an opening 107f formed in the interlayer dielectric layer 107. The n-side electrode 115 is in ohmic contact with the n-side contact layer 325 through an opening 107g formed in the interlayer dielectric film 107.

The p-side electrode 121 is formed of, for example, Ti/Pt/Au. The p-side electrode 121 may also be in the form of a transparent electrode formed of, for example, indium oxide doped with tin oxide (ITO) or zinc oxide (ZnO).

Although the semiconductor thin film having a light emitting element 330 is mounted on the driver circuit region, the light emitting element 30 need not be on the driver circuit. For example, the semiconductor thin film may be mounted on a region where no driver circuit is formed, the region being adjacent to the driver circuit region. Still alternatively, the semiconductor thin film may be formed on a substrate where no driver circuit is formed.

As described above, the composite semiconductor device of the third embodiment includes light emitting elements formed by selectively diffusing an impurity of second conductive type. Just as in the second embodiment, the semiconductor thin film 20 and n-side electrode 115 in each of two adjacent light emitting elements 30 are arranged such that the n-side electrodes 115 of the two adjacent light emitting elements 30 lie side by side and are between semiconductor thin films 20 of the two adjacent light emitting elements 30. Therefore, the composite semiconductor device of the third embodiment provides the same advantage as the composite semiconductor device of the second embodiment.

Fourth Embodiment

Figure 9:
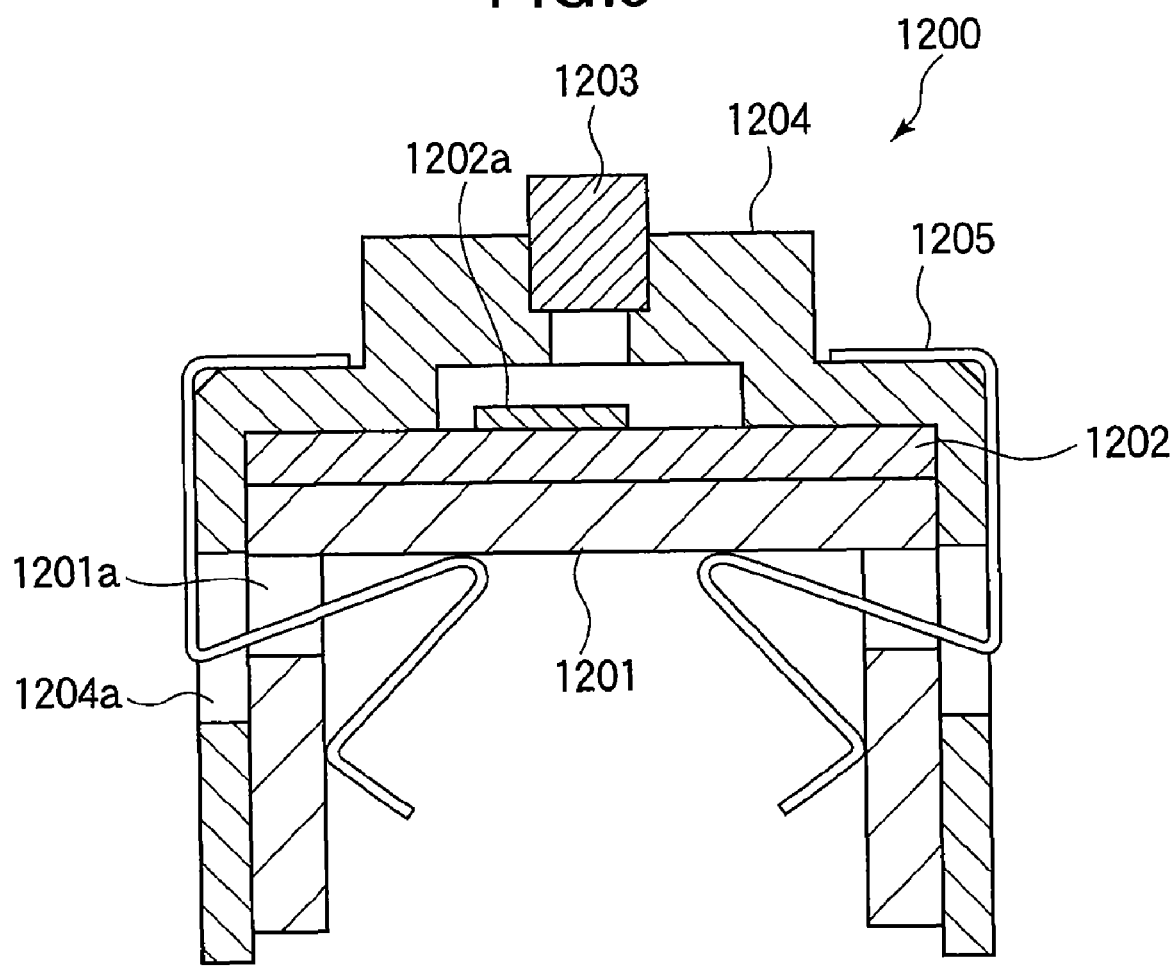
FIG. 9 illustrates an LED print head of a fourth embodiment.

FIG. 9 illustrates an LED print head 1200 of a fourth embodiment.

An LED unit 1202 is mounted on a base 1201. The LED unit 1202 includes one of the composite semiconductor devices of the first to third embodiments.

Figure 10:
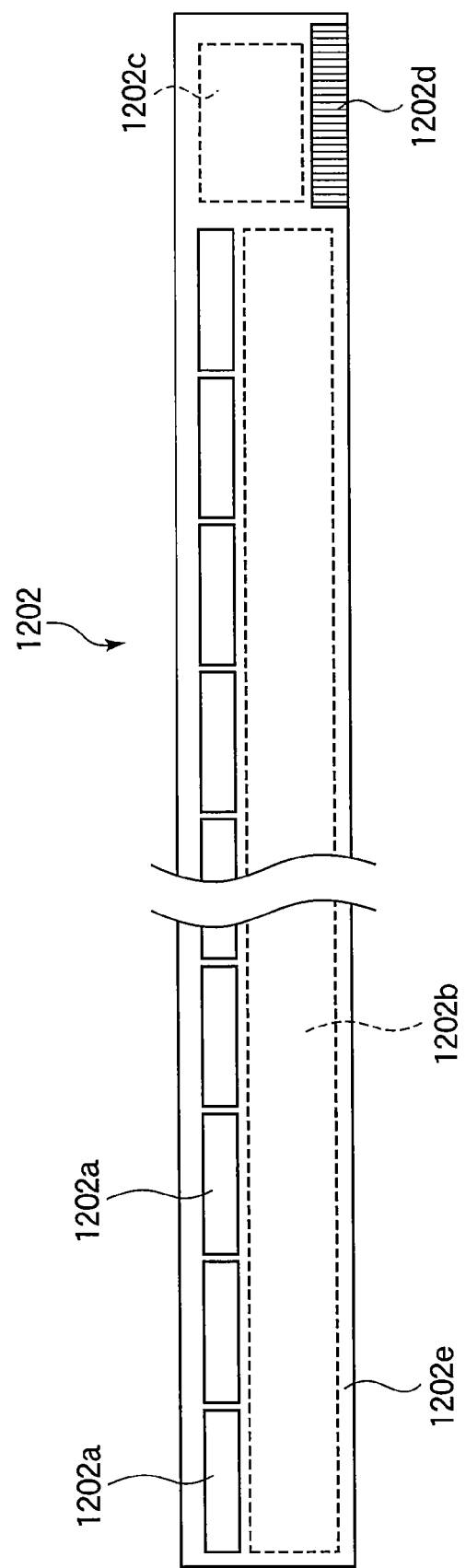
FIG. 10 is a top view of an LED unit for the LED print head.

FIG. 10 is a top view of the LED unit 1202. A plurality of composite semiconductor devices 1202a are mounted on a printed circuit board 1202e, and are aligned in an end-to-end arrangement. Each of composite semiconductor devices 1202a includes light emitting regions and driver circuits. The print circuit board 1202e includes areas 1202b and 1202c in which other electronic parts are mounted and interconnected. A connector 1202d is provided for communicating signals between the LED unit 1202 and external circuits and for receiving electric power from an external power supply.

A rod lens 1203 is disposed over the light emitting regions of the composite semiconductor devices 1202a such that a plurality of cylindrical optical lenses are aligned along a row of the light emitting regions (e.g., semiconductor layer 312 in FIG. 6). The rod lens 1203 is held in position by a lens holder 1204, and focuses the light emitted from the light emitting regions.

The lens holder 1204 is formed to cover the base 1201 and LED unit 1202. The base 1201, LED unit 1202, and lens holder 1204 are held together by clampers 1205 that extend through opening 1201a and 1204a formed in the base 1201 and lens holder 1204. The light emitted from the LED unit 1202 passes through the rod lens array 1203 toward an external structure. The LED print head 1200 may be used as an exposing unit for, for example, electrophotographic printers and electrophotographic copying machines.

The LED unit 1202 employs one of the composite semiconductor devices of the first to third embodiments. Thus, an LED print head with high reliability may be obtained.

Fifth Embodiment

Figure 11:
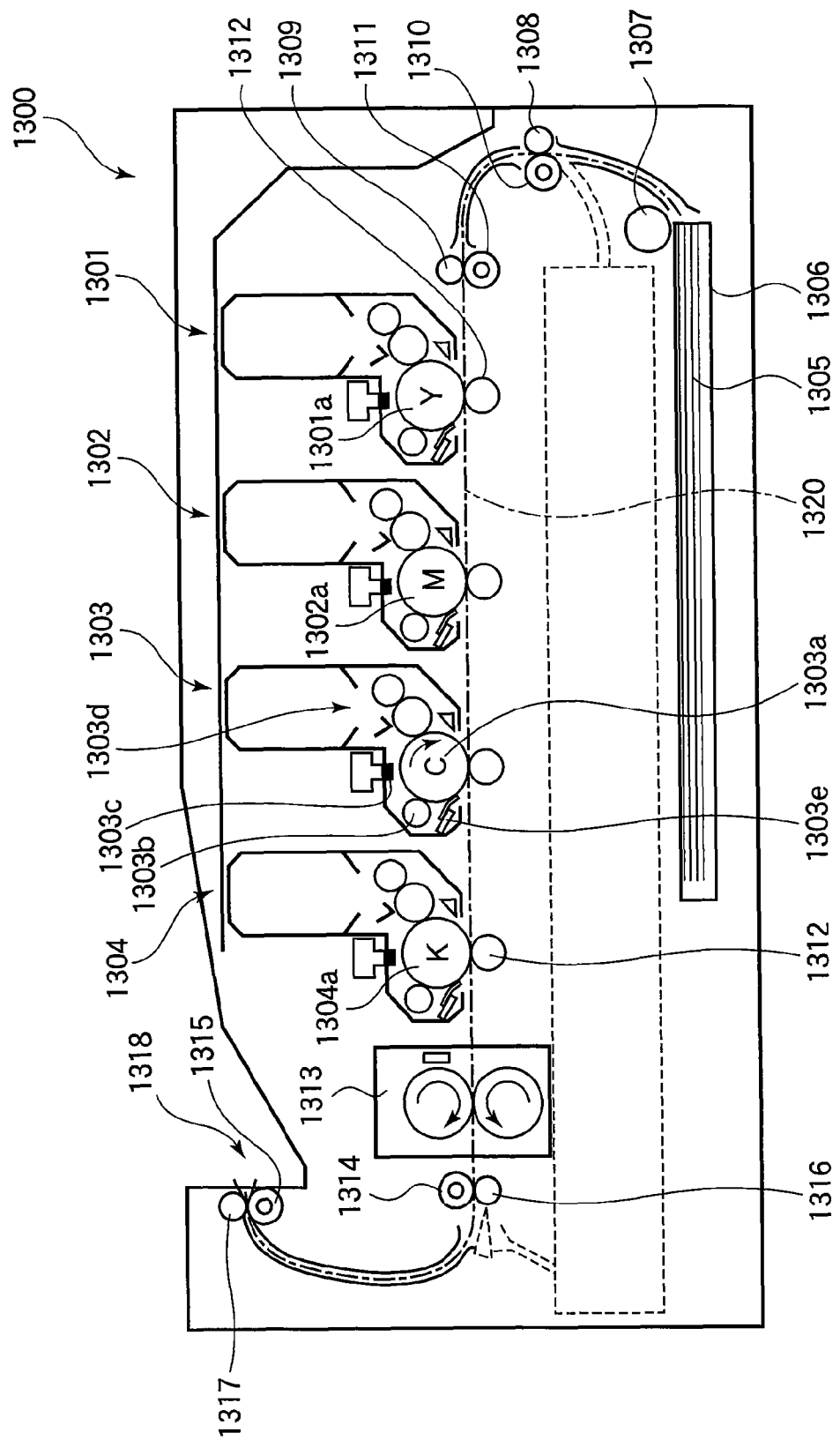
FIG. 11 illustrates a pertinent portion of an image forming apparatus of a fifth embodiment.

FIG. 11 illustrates a pertinent portion of an image forming apparatus 1300 of a fifth embodiment.

Referring to FIG. 11, the image forming apparatus 1300 includes four process units 1301-1304 aligned along a transport path 1320 of a recording medium 1305. The process units 1301-1304 form yellow, magenta, cyan, and black images, respectively. The process units 1301-1304 are identical in configuration. For simplicity, only the operation of the cyan process unit 1303 will be described, it being understood that the others may work in a similar fashion.

The process unit 1303 includes a photoconductive drum 1303a rotatable in a direction shown by an arrow. A charging unit 1303b, an exposing unit 1303c, a developing unit 1303d, and a cleaning unit 1303e are disposed around the photoconductive drum 1303a from upstream to downstream with respect to rotation of the photoconductive drum 1303a. The charging unit 1303b charges the surface of the photoconductive drum 1303a. The exposing unit 1303c illuminates the charged surface of the photoconductive drum 1303a to form an electrostatic latent image. The developing unit 1303d supplies toner to the electrostatic latent image to form a cyan toner image. The cleaning unit 1303a removes residual toner from the photoconductive drum 1303a. The drums and rollers in the respective process units are driven in rotation by a drive source (not shown).

The image forming apparatus 1300 incorporates a paper cassette 1306 at its lower portion, the paper cassette 1306 holding a stack of the recording medium 1305 such as paper. A hopping roller 1307 advances an uppermost sheet of the stack of the recording medium 1305 into the transport path 1320. Registration rollers 1310 and 1311 are located downstream of the hopping roller 1307, and correct the skew of the recording medium 1305. The registration rollers 1310 and 1311 hold the recording medium 1305 between pinch rollers 1308 and 1309 in sandwiched relation, thereby transporting the recording medium 1305 into the yellow process unit 1301. The hopping roller 1307 and registration rollers 1310 and 1311 are operatively driven by a drive source and gears (not shown).

A transfer roller 1312 is formed of a semiconductive rubber material, and is disposed to extend in parallel to the photoconductive drum in each process unit. A high voltage is applied across the photoconductive drum and the transfer roller 1312 to develop a potential difference across them, thereby transferring the toner image of a corresponding color onto the recording medium 1305.

A fixing unit 1313 includes a heat roller and a pressure roller in pressure contact with the heat roller to define a fixing point between the heat roller and the pressure roller. As the recording medium 1305 passes through the fixing point, the toner images are fused into a permanent full color image. Discharge rollers 1314 and 1315 hold the recording medium 1305 between them in sandwiched relation, and discharge the recording medium 1305 onto a stacker 1318. The discharge rollers 1314 and 1315 are driven in rotation by a drive source and gears (not shown). The exposing unit 1303c may be the LED print head 1200 of the fourth embodiment.

The operation of the image forming apparatus of the aforementioned configuration will be described. The hopping roller 1307 advances the uppermost sheet of the recording medium 1305 from the paper cassette 1306. The registration rollers 1310 and 1311 hold the recording medium 1305 between the pinch rollers 1308 and 1309 in sandwiched relation, and transport the recording medium 1305 to a transfer point defined between the photoconductive drum of the process unit 1301 and the transfer roller 1312. As the recording medium 1305 passes through the transfer point, the toner image is transferred onto the recording medium 1305.

Subsequently, the recording medium passes through transfer points at the process units 1302-1304 such that the toner images of the respective colors are transferred onto the recording medium 1305 in registration. Then, the toner images on the recording medium 1305 are fused into a full color permanent image as the recording medium 1305 passes through the fixing point. The recording medium 1305 is then held between the discharge rollers 1314 and 1315 and pinch rollers 1316 and 1317 in sandwiched relation, and is discharged onto the stacker 1318.

Employing the LED print head of the fourth embodiment offers a small size, reliable image forming apparatus.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A composite semiconductor device, comprising:
a plurality of semiconductor thin film devices, each device being a light emitting element and including a first contact region for a first electrical connection and a second contact region for a second electrical connection, the first contact region being in a light emitting region and the second contact region being in a region different from the light emitting region;
a substrate on which said semiconductor thin film devices are attached such that the devices are aligned in a single row and the first contact region and the second contact region are aligned one behind the other in the single row;
a first electrode connected to the first contact region, said first electrode extending beyond and away from the first contact region in a direction substantially perpendicular to and in the plane of the single row; and
a second electrode connected to the second contact region, said second electrode extending beyond and away from the second contact region in a direction substantially perpendicular to and in the plane of the single row.

2. The composite semiconductor device according to claim 1, wherein said substrate includes driver circuits formed on said substrate that drive said semiconductor thin film devices;
wherein the first contact region and the second contact region are connected to the driver circuits with thin film wirings.

3. The composite semiconductor device according to claim 1, wherein adjacent semiconductor thin film devices are arranged such that the first electrode of one of the adjacent semiconductor thin film devices and the first electrode of the other of the adjacent semiconductor thin film devices are disposed between the second electrode of the one of the adjacent semiconductor thin film devices and the second electrode of the other of the semiconductor thin film devices.

4. The composite semiconductor device according to claim 1, wherein said light emitting device is a light emitting diode.

5. An LED print head incorporating a plurality of composite semiconductor devices according to claim 4, comprising:
a supporting material that supports the plurality of composite semiconductor devices including a light emitting diode array, the light emitting diodes being disposed in a row; and
a lens array that directs light emitted from the light emitting diodes.

6. An image forming apparatus incorporating said LED print head according to claim 5, comprising:
an image bearing body;
an exposing unit that selectively illuminates a charged surface of said image bearing body to form an electrostatic latent image; and
a developing unit that develops the electrostatic latent image.

7. The composite semiconductor device according to claim 1, wherein the first contact region is a region in which light is emitted.

8. A composite semiconductor device, comprising:
a plurality of semiconductor thin film devices, each device being a light emitting element and including a first contact region for a first electrical connection and a second contact region for a second electrical connection, the first contact region being in a light emitting region and the second contact region being in a region different from the light emitting region; and
a substrate on which said semiconductor thin film devices are attached such that the devices are aligned in a single row and the first contact region and the second contact region are aligned one behind the other in the single row,
wherein each of the semiconductor thin film devices includes a first electrode connected to the first contact region, and a second electrode connected to the second contact region; and
wherein adjacent semiconductor thin film devices are arranged such that the first electrode of one of the adjacent semiconductor thin film devices and the first electrode of the other of the adjacent semiconductor thin film devices are disposed between the second electrode of the one of the adjacent semiconductor thin film devices and the second electrode of the other of the semiconductor thin film devices.

9. An image forming apparatus comprising:
an image bearing body;
an exposing unit that selectively illuminates a charged surface of said image bearing body to form an electrostatic latent image;
a developing unit that develops the electrostatic latent image; and
a print head comprising:
a supporting material that supports a plurality of composite semiconductor devices; and
a lens array that directs light emitted from the composite semiconductor devices;
said composite semiconductor devices comprising:
a plurality of semiconductor thin film devices, each semiconductor thin film device being a light emitting diode and including a first contact region for a first electrical connection and a second contact region for a second electrical connection, the first contact region being in a light emitting region and the second contact region being in a region different from the light emitting region; and
a substrate on which said semiconductor thin film devices are attached such that the semiconductor thin film devices are aligned in a single row and the first contact region and the second contact region are aligned one behind the other in the single row, wherein adjacent semiconductor thin film devices are arranged such that a first electrode of one of the adjacent semiconductor thin film devices and a first electrode of the other of the adjacent semiconductor thin film devices are disposed between a second electrode of the one of the adjacent semiconductor thin film devices and a second electrode of the other of the semiconductor thin film devices.

10. The composite semiconductor device of claim 8, wherein said first electrode extends beyond and away from the first contact region in a direction substantially perpendicular to and in the plane of the single row, and said second electrode extends beyond and away from the second contact region in a direction substantially perpendicular to and in the plane of the single row.

11. The image forming apparatus of claim 9, wherein said first electrode extends beyond and away from the first contact region in a direction substantially perpendicular to and in the plane of the single row, and said second electrode extends beyond and away from the second contact region in a direction substantially perpendicular to and in the plane of the single row.

* * * * *